United States Patent
Ittel et al.

(10) Patent No.: US 8,486,308 B2
(45) Date of Patent: Jul. 16, 2013

(54) CONDUCTIVE PASTE COMPOSITION CONTAINING LITHIUM, AND ARTICLES MADE THEREFROM

(75) Inventors: Steven Dale Ittel, Wilmington, DE (US); Zhigang Rick Li, Hockessin, DE (US); Kurt Richard Mikeska, Hockessin, DE (US); Paul Douglas Vernooy, Hockesssin, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/314,252

(22) Filed: Dec. 8, 2011

(65) Prior Publication Data

US 2012/0313198 A1    Dec. 13, 2012

Related U.S. Application Data

(60) Provisional application No. 61/424,259, filed on Dec. 17, 2010.

(51) Int. Cl.
   *H01B 1/22*   (2006.01)
   *B05D 5/12*   (2006.01)

(52) U.S. Cl.
   USPC .......................... 252/514; 427/125

(58) Field of Classification Search
   USPC .................. 252/512–514; 427/96.1, 125
   See application file for complete search history.

(56) References Cited

U.S. PATENT DOCUMENTS

| | | | |
|---|---|---|---|
| 5,089,172 A | | 2/1992 | Allison et al. |
| 5,376,596 A | * | 12/1994 | Tokuda et al. ............... 501/19 |
| 5,393,558 A | | 2/1995 | Allison et al. |
| 5,670,089 A | | 9/1997 | Oba et al. |
| 5,714,246 A | | 2/1998 | Shaikh et al. |
| 6,207,288 B1 | | 3/2001 | Bloom |
| 7,030,048 B2 | | 4/2006 | Cho et al. |
| 7,087,293 B2 | | 8/2006 | Cho et al. |
| 7,780,878 B2 | | 8/2010 | Young et al. |
| 7,790,065 B2 | | 9/2010 | Young et al. |
| 2009/0101872 A1 | | 4/2009 | Young et al. |
| 2009/0104456 A1 | | 4/2009 | Carroll et al. |
| 2009/0301554 A1 | | 12/2009 | Konno et al. |
| 2010/0236621 A1 | | 9/2010 | Konno et al. |
| 2010/0258184 A1 | | 10/2010 | Laughlin et al. |

FOREIGN PATENT DOCUMENTS

JP       2005347276 A    12/2005

OTHER PUBLICATIONS

International Search Report dated Mar. 20, 2012, PCT International Application No. PCT/US2011/064379.
Ittel, Steven Dale et al., U.S. Appl. No. 13/315,318, filed Dec. 9, 2011.

* cited by examiner

*Primary Examiner* — Mark Kopec

(57) ABSTRACT

A lead-free paste composition contains an electrically conductive silver powder, one or more glass frits or fluxes, and a lithium compound dispersed in an organic medium. The paste is useful in forming an electrical contact on the front side of a solar cell device having an insulating layer. The lithium compound aids in establishing a low-resistance electrical contact between the front-side metallization and underlying semiconductor substrate during firing.

19 Claims, 1 Drawing Sheet

CONDUCTIVE PASTE COMPOSITION CONTAINING LITHIUM, AND ARTICLES MADE THEREFROM

This application claims the benefit of U.S. Provisional Application No. 61/424,259, filed Dec. 17, 2010 which is herein incorporated by reference.

FIELD OF THE INVENTION

This invention relates to lead-free paste compositions containing lithium that are suitable for fabricating electrically conductive structures that can be used in a variety of electrical and electronic devices including photovoltaic cells.

TECHNICAL BACKGROUND OF THE INVENTION

A conventional photovoltaic cell structure is fashioned by bringing together n-type and p-type semiconductors to form a p-n junction. A negative electrode is typically located on the side of the cell that is to be exposed to a light source (the "front" side, which in the case of a solar cell is the side exposed to sunlight), and a positive electrode is located on the other side of the cell (the "back" side). Radiation of an appropriate wavelength falling on a p-n junction of a semiconductor body serves as a source of external energy to generate electron-hole pairs in that body. Because of the potential difference that exists at a p-n junction, holes and electrons move across the junction in opposite directions, giving rise to the flow of an electric current that is capable of delivering power to an external circuit. Most industrial photovoltaic cells, including solar cells, are provided in the form of a structure, such as one based on a doped crystalline silicon wafer, that has been metallized, i.e., provided with electrodes in the form of electrically conductive metal contacts through which the generated current can flow to the external electric circuit load.

Photovoltaic cells are commonly fabricated with a front-side insulating layer that affords an antireflective property to the cell to maximize the utilization of incident light. However, in this configuration, the insulating layer normally must be removed to allow an overlaid front-side electrode to make contact with the underlying semiconductor surface. The front-side electrode is typically formed by first depositing a metal-powder-bearing, conductive paste composition in a suitable pattern by screen printing. Thereafter, the paste is fired to dissolve or otherwise penetrate the insulating layer and sinter the metal powder, such that an electrical connection with the semiconductor is formed.

The ability of the paste composition to penetrate the antireflective coating and form a strong bond with the substrate upon firing is highly dependent on the composition of the conductive paste and firing conditions. Efficiency, a key measure of photovoltaic cell performance, is also influenced by the quality of the electrical contact made between the fired conductive paste and the substrate.

Allison et al. (U.S. Pat. Nos. 5,089,172 and 5,393,558) disclose a thick-film conductor composition that can be bonded to a ceramic substrate fashioned from aluminum nitride.

Although various methods and compositions useful in forming devices such as photovoltaic cells are known, there nevertheless remains a need for compositions that permit fabrication of patterned conductive structures that result in improved overall device electrical performance and that facilitate the efficient manufacture of such devices. A lead-free composition would be particularly desirable.

SUMMARY OF THE INVENTION

In an aspect, the present invention provides a paste composition comprising an inorganic solid portion comprising:
(a) about 75% to about 99% by weight based on solids of a source of electrically conductive metal;
(b) about 0.1% to about 10% by weight based on solids of a glass component comprising:
1-25 wt. % of $SiO_2$;
0.1-3 wt. % of $Al_2O_3$;
50-85 wt. % of at least one of bismuth oxide and bismuth fluoride, the amount of bismuth oxide being at least 10 wt. % and the amount of bismuth fluoride being at most 50 wt. %; and
at least 1 wt. % of at least one of $TiO_2$, $ZrO_2$, $Li_2O$, ZnO, $P_2O_5$, LiF, NaF, KF, $K_2O$, $V_2O_5$, $GeO_2$, $CeO_2$, or a mixture thereof;
wherein the weight percentages are based on the total glass component; and
(c) about 0.1 to about 5% by weight based on solids of a lithium-containing additive;
wherein the inorganic solid portion is dispersed in an organic medium and the paste composition is substantially Pb-free.

In another aspect, there is provided an article comprising:
(a) a semiconductor substrate having a first major surface; and
(b) a deposit of a substantially Pb-free paste composition on a preselected portion of the first major surface of the semiconductor substrate,
wherein the paste composition comprises an inorganic solid portion dispersed in an organic medium, the inorganic solid portion comprising:
(i) about 75% to about 99% by weight based on solids of a source of an electrically conductive metal;
(ii) about 0.1% to about 10% by weight based on solids of a glass component; and
(iii) about 0.1% to about 5% by weight of a lithium-containing additive.

In still a further aspect, there is provided a process comprising:
(a) providing a semiconductor substrate having a first major surface;
(b) applying a substantially Pb-free paste composition onto a preselected portion of the first major surface,
wherein the paste composition comprises an inorganic solid portion dispersed in an organic medium and the inorganic solid portion comprises:
(i) about 75% to about 99% by weight based on solids of a source of an electrically conductive metal;
(ii) about 0.1% to about 10% by weight based on solids of a glass component; and
(iii) about 0.1% to about 5% by weight based on solids of a lithium-containing additive; and
(c) firing the substrate and the paste composition, whereby the organic medium of the paste composition is removed and an electrode is formed that has electrical contact with the semiconductor substrate.

In various embodiments, there are provided an article and a photovoltaic cell fabricated using the foregoing process.

BRIEF DESCRIPTION OF THE DRAWING

The invention will be more fully understood and further advantages will become apparent when reference is made to the following detailed description of the preferred embodiments of the invention and the accompanying drawing, in which.

Figure 1A:
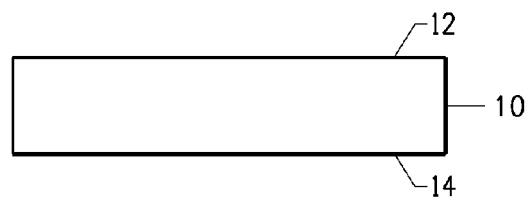
FIGS. 1A-1F depict the successive steps of a process by which a semiconductor module may be fabricated. The module may in turn be incorporated into a photovoltaic cell. Reference numerals as used in FIG. 1 include the following.

10: p-type substrate
12: first major surface (front side) of substrate 10
14: second major surface (back side) of substrate 10
20: n-type diffusion layer
30: insulating layer
40: p+ layer
60: aluminum paste formed on back side
61: aluminum back electrode (obtained by firing back-side aluminum paste)
70: silver or silver/aluminum paste formed on back side
71: silver or silver/aluminum back electrode (obtained by firing back-side silver paste)
500: silver paste formed on front side according to the invention
501: silver front electrode according to the invention (formed by firing front-side silver paste)

DETAILED DESCRIPTION OF THE INVENTION

Solar-powered photovoltaic systems are considered to be environmentally beneficial in that they reduce the need for fossil fuels. Nonetheless, most current photovoltaic systems are based upon components that contain relatively high levels of the element lead. Reduction of lead and other heavy metals in the environment is also considered an important environmental goal. To that end, photovoltaic systems that are lead-free would be highly advantageous.

The present invention addresses the need for a process to manufacture high-performance semiconductor devices using conductor compositions that do not require lead, but still provide mechanically robust, high-conductivity electrodes. The conductive paste composition provided herein is beneficially employed in the fabrication of front-side electrodes of photovoltaic devices, which must make good electrical contact despite the presence of a front-side insulating layer typically included in such devices.

In an aspect, this invention provides a paste composition that comprises: a functional conductive component, such as a source of electrically conductive metal; a substantially lead-free glass component; and an organic medium. The paste composition also includes a lithium-containing component, such as an additive comprising lithium oxide, lithium hydroxide, a lithium salt of an inorganic or organic acid, or a mixture thereof. The lithium compound aids in etching an insulating layer (also termed an insulating film) frequently used as an antireflective coating on the front surface of a semiconductor substrate and in establishing a low-resistance electrical contact between the front-side metallization and underlying semiconductor substrate. The insulating layer often used as an antireflective coating is silicon nitride. The paste composition may include additional components.

The paste composition may contain in admixture an inorganic solids portion comprising (a) about 75% to about 99% by weight of a source of an electrically conductive metal; (b) about 0.1% to about 10% by weight of a substantially lead-free glass component; and (c) about 0.1% to about 5% by weight, or about 0.1% to about 3% by weight, or about 0.2% to about 1% by weight, of at least one lithium-containing additive; wherein the above stated contents are based on the total weight of all the constituents of the inorganic solid portion of the composition.

As further described below, the composition also comprises an organic medium, which acts as a carrier for the inorganic solid portion dispersed therein. In an embodiment, the inorganic solid portion of the paste composition comprises about 85% to about 95% by weight based on the entire composition, the balance being the organics. In another embodiment, the inorganic solid portion of the paste composition comprises about 87% to about 93% by weight.

The paste composition described above can be used to form a conductive electrode employed in an electrical or electronic device such as a photovoltaic cell or an array of such cells. Alternatively, the composition can be used to form conductors used in conjunction with circuit elements in a semiconductor module that is to be incorporated into an electrical or electronic device. The paste composition described herein can be termed "conductive," meaning that an electrode structure formed on a substrate using the composition and thereafter fired exhibits an electrical conductivity sufficient for conducting electrical current between devices or circuitry connected thereto.

In an embodiment, the source of electrically conductive metal providing the functional conductive component in the present paste composition is electrically conductive metal powder incorporated directly as part of the inorganic solids of the composition. In another embodiment, a mixture of two or more such metals is directly incorporated. Alternatively, the electrically conductive metal may be supplied by a metal oxide or salt that decomposes upon exposure to the heat of firing to form the metal. Electrically conductive metals suitable for use include those that are or contain gold, silver, copper, nickel, and/or palladium, as well as alloys and mixtures thereof. Silver is preferred. As used herein, the term "silver" is to be understood as referring to elemental silver metal, alloys of silver, and mixtures thereof, and may further include silver oxide ($Ag_2O$) or silver salts such as AgCl, $AgNO_3$, $AgOOCCH_3$ (silver acetate), $AgOOCF_3$ (silver trifluoroacetate), $Ag_3PO_4$ (silver orthophosphate), or mixtures thereof.

In an embodiment, the paste composition contains about 75 to about 99% by weight, or about 80 to about 90% by weight, of a source of an electrically conductive metal, the weight percentages based on the inorganics portion.

The electrically conductive metal may be supplied as finely divided particles having any one or more of the following morphologies: a powder form, a flake form, a spherical form, a granular form, a nodular form, a crystalline form, an irregular form, or a mixture thereof. In an embodiment, the inorganic portion of the electrically conductive metal component may include about 70 to about 90 wt. % metal particles and about 1 to about 9 wt. % metal flakes, based on the total content of inorganics. In another embodiment, the inorganic portion of the metal component may include about 70 to about 90 wt. % metal flakes and about 1 to about 9 wt. % of colloidal metal. In a further embodiment, the inorganic portion of the metal component may include about 60 to about 90 wt. % of metal particles or metal flakes and about 0.1 to about 20 wt. % of colloidal metal.

The particle size of metal used in the present paste composition is not subject to any particular limitation. As used herein, "average particle size" is intended to refer to "median particle size," by which is meant the 50% volume distribution size. Volume distribution size may be determined by a number of methods understood by one of skill in the art, including but not limited to laser diffraction and dispersion methods employed by a Microtrac particle size analyzer (Montgomeryville, Pa.). Dynamic light scattering, may also be used, as well as direct microscopy. Instruments for such measurements are available commercially, e.g. the LA-910 particle size analyzer from Horiba Instruments Inc., Irvine, Calif. In various embodiments, the average particle size of metal particles of the present paste composition is less than 10 microns, or the average particle size is less than 5 microns. The electrically conductive metal or source thereof may also be provided in a colloidal suspension, in which case the colloidal carrier would not be included in any calculation of weight percentages of the inorganics of which the colloidal material is part.

The electrically conductive metal used herein, particularly when in powder form, may be coated or uncoated; for example, it may be at least partially coated with a surfactant. Suitable coating surfactants include, for example, stearic acid, palmitic acid, a salt of stearate, a salt of palmitate, and mixtures thereof. Other surfactants that may also be utilized include lauric acid, oleic acid, capric acid, myristic acid, linolic acid, and mixtures thereof. Still other surfactants that may also be utilized include polyethylene oxide, polyethylene glycol, benzotriazole, poly(ethylene glycol)acetic acid and other similar organic molecules. A suitable counter-ion for use in a coating surfactant includes without limitation hydrogen, ammonium, sodium, potassium, and mixtures thereof. When the electrically conductive metal is silver, it may be coated, for example, with a phosphorus-containing compound.

In an embodiment, one or more surfactants may be included in the organic medium in addition to surfactant included as a coating of conductive metal powder used in the present paste composition.

As further described below, the electrically conductive metal can be dispersed in an organic medium that acts as a carrier for the metal phase and other constituents present in the formulation.

Another component in the present paste composition is a glass material, such as a glass frit, or a mixture of two or more glass materials. The glass component may include, for example, substantially lead-free, non-crystalline glass materials such as glass formers, intermediate oxides, and/or modifiers. As used in the present specification and the subjoined claims, the phrase "substantially lead-free" refers to a composition to which no lead has been specifically added (either as elemental lead or as a lead-containing alloy, compound, or other like substance), and in which the amount of lead present as a trace component or impurity is 1000 parts per million (ppm) or less. In some embodiments, the amount of lead present as a trace component or impurity is less than 500 parts per million (ppm), or less than 300 ppm, or less than 100 ppm. The minimization of lead in the present paste composition facilitates the disposal or recycling of devices constructed with the composition and mitigates the health hazard associated with the known toxicity of lead-bearing substances, such as the present composition.

Exemplary glass formers can have a high bond coordination and a small ionic size, and can form bridging covalent bonds when heated and quenched from a melt. Exemplary glass formers include without limitation $SiO_2$, $B_2O_3$, $P_2O_5$, $V_2O_5$, $TeO_2$, $GeO_2$, and the like. Intermediate oxides can be substituted for glass formers, and exemplary intermediate oxides include without limitation $TiO_2$, $Ta_2O_5$, $Nb_2O_5$, $ZrO_2$, $CeO_2$, $Gd_2O_3$, $SnO_2$, $Al_2O_3$, $HfO_2$, and the like. Glass modifiers typically have a more ionic nature, and may terminate bonds, or affect specific properties such as viscosity or glass wetting. Exemplary modifiers include without limitation oxides such as alkali metal oxides, alkaline earth oxides, CuO, ZnO, $Bi_2O_3$, $Ag_2O$, $MoO_3$, $WO_3$, and the like. Optionally, the viscosity of a glass may be reduced by the introduction of fluoride anions. For example, fluorine may be supplied from at least one fluoride of Al, Li, Na, K, Mg, Ca, Sr, Ba, Zn, Bi, Ta, Zr, Hf, Mo, W, Gd, Ce, Ti, Mn, Sn, Ru, Co, Fe, Cu, Cr, or a mixture thereof. If present, the amount of fluoride is such that the glass component comprises at most 5 wt. % of elemental fluorine. In one particular embodiment hereof, silver oxide may be dissolved in the glass during the glass melting/manufacturing process.

As used herein, the terms "glass frit" and "frit" refer to a particulate form of amorphous, solid oxide in which short-range atomic order is preserved in the immediate vicinity of any selected atom, that is, in the first coordination ring, but dissipates at greater atomic-level distances (i.e., no long range periodic order). Frit is conventionally formed by grinding a bulk solid of the requisite composition to a particulate state.

The glass component of the present composition may also include a flux material, which is a substance that when heated aids, induces, or otherwise actively participates in wetting, fusion, and flow. A flux material often aids the glass, for example, in bonding at an interface or in promoting sintering of the conductive metal. A flux may be added to other bulk materials to provide greater flow or fusion than the bulk material would itself experience at a selected temperature. A flux material may be fully amorphous, or it may exhibit some degree of crystallinity, such that its powder X-ray diffraction pattern may include either or both of a broad amorphous halo and sharp crystalline peaks that define characteristic interatomic distances in accordance with Bragg's law. In addition, heating an amorphous frit or flux material may cause it to become partially or fully devitrified. A frit material may have wetting, fusion, or flow properties similar to a crystalline flux material, and vice versa. A skilled person will thus recognize that there exists a continuum between fluxes and frits. Exemplary crystalline flux materials may be an oxide or non-oxide, and may comprise materials such as $BiF_3$, $Bi_2O_3$, or the like.

The glass material used in the present composition is believed to assist in the partial or complete penetration of oxide or nitride insulating layers on a silicon semiconductor wafer during firing. As described herein, this at least partial penetration may facilitate the formation of an effective, mechanically robust electrical contact between a conductive structure printed using the present composition and the underlying silicon semiconductor surface of a photovoltaic device structure.

In an embodiment, the present paste composition may contain about 0.1 to about 10% by weight, or about 0.5 to about 8% by weight, or about 0.5 to about 5% by weight, or about 1 to about 3% by weight, of the glass component.

In a preferred embodiment, the present composition includes crystalline flux material and an amorphous frit material, for example, a frit material having a glass transition temperature ($T_g$) value in the range of about 300 to 600° C.

In an embodiment, the glass component is substantially lead-free and comprises the chemical elements silicon, aluminum, and bismuth admixed with at least one other element beyond oxygen and fluorine. More specifically, the glass component comprises 1-25 wt. % of $SiO_2$; 0.1-3 wt. % of $Al_2O_3$; 50-85 wt. % of at least one of $Bi_2O_3$, $BiF_3$, or a mixture thereof, with the provisos that the $Bi_2O_3$ content be at least 10 wt. % and the $BiF_3$ content be at most 50 wt. %; and at least 1 wt. % of at least one of $TiO_2$, $ZrO_2$, $Li_2O$, ZnO, $P_2O_5$, LiF, NaF, KF, $K_2O$, $V_2O_5$, $GeO_2$, $TeO_2$, $CeO_2$, $Gd_2O_3$, or a mixture thereof, wherein the weight percentages are based on the total glass component. In an another embodiment, the glass component comprises 8-25 wt. % of $SiO_2$; 0.1-3 wt. % of $Al_2O_3$; 50-85 wt. % of at least one of $Bi_2O_3$, $BiF_3$, or a mixture thereof, with the provisos that the $Bi_2O_3$ content be at least 10 wt. % and the $BiF_3$ content be at most 50 wt. %; and at least 1 wt. % of at least one of $TiO_2$, $ZrO_2$, $Li_2O$, ZnO, $P_2O_5$, LiF, NaF, KF, $K_2O$, $V_2O_5$, $GeO_2$, $TeO_2$, $CeO_2$, $Gd_2O_3$, or a mixture thereof, wherein the weight percentages are based on the total glass component.

In still another embodiment, the glass component is substantially lead-free and consists essentially of:
  8-25 wt. % of $SiO_2$;
  0.1-3 wt. % of $Al_2O_3$;
  50-85 wt. % of at least one of $Bi_2O_3$, $BiF_3$, or a mixture thereof, with the provisos that the $Bi_2O_3$ content be at least 10 wt. % and the $BiF_3$ content be at most 50 wt. %;
  0-10 wt. % of $B_2O_3$;
  0-5 wt. % of at least one of $Li_2O$, $Na_2O$, or $K_2O$;
  0-5 wt. % of at least one of MgO, CaO, SrO, or BaO;
  0-5 wt. % of at least one oxide of Zn, Ta, Zr, Hf, Mo, W, Gd, Ce, Te, Ti, Mn, Sn, Ru, Co, Fe, Cu, Cr, or a mixture thereof; and
  0-10 wt. % of at least one fluoride of Al, Li, Na, K, Mg, Ca, Sr, Ba, Zn, Ta, Zr, Hf, Mo, W, Gd, Ce, Ti, Mn, Sn, Ru, Co, Fe, Cu, Cr, or a mixture thereof;
  wherein the weight percentages are based on the total glass component.

The various compounds in the compositions recited herein are specified on the basis of the most common valence state of the respective cation. However, a skilled person would recognize that some of the cations, e.g. Bi, may exist in other valence states, which may be used in suitable amounts in formulating the glass composition. Thus, Bi cations may be supplied from compounds in which the Bi can take on any of its possible valence states, and not just its most common trivalent state.

Glass materials, such as those having the formulations set forth above, may be used individually, or together in a blend of plural materials in which the proportions in each constituent are adjusted to provide the desired performance, including the etching of any insulating layer present in a photovoltaic cell and the formation of a high-quality electrical contact, as described in more detail hereinbelow. The oxide or fluoride materials comprised in each of the one or more glass materials used in the glass component of the present paste composition are melted together to form an intimate mixture prior to their incorporation in the paste composition.

The glass material used in the present paste composition can have a variety of average particle sizes. In an embodiment, the average particle size can range from about 0.5 to 3.5 μm. In another embodiment, the average particle size ranges from about 0.8 to 1.2 μm. The glass material can be produced by conventional glass-making techniques, including, for example, those in which ingredients are weighed and mixed in the desired proportions and heated in a platinum alloy crucible in a suitable furnace to form a melt. Heating is conducted to a temperature of about 1000° C. to 1200° C. for a time sufficient for the melt to become entirely liquid and homogeneous. Thereafter, the molten glass is quenched and comminuted to provide the desired particle size. In an embodiment, the glass material is supplied as a powder with its 50% volume distribution ($d_{50}$) between 1 and 3 microns. Alternative synthesis techniques may also be used for making the glass components useful in the present paste composition. These techniques include, but are not limited to, water quenching, sol-gel, spray pyrolysis, or others appropriate for making powder forms of glass.

The present composition further includes a discrete lithium-containing additive substance, such as a crystalline lithium-containing compound or a lithium-containing salt, or a mixture of two or more thereof. A suitable lithium-containing component may be in powder form, and may include at least one substance such as lithium carbonate ($Li_2CO_3$), lithium oxide ($Li_2O$), lithium hydroxide (LiOH), lithium fluoride (LiF), lithium phosphate ($Li_3PO_4$), other lithium salts of inorganic or organic acids including lithium soaps, or any compound that can generate metal oxides of lithium during a firing process, as well as mixtures thereof. In an embodiment, the additive may also be a mixed oxide of lithium and another metal. The lithium-containing additive comprises about 0.1% to about 5% by weight, or about 0.1% to about 3% by weight, or about 0.2% to about 1% by weight, of the lithium-containing component, based on the solids of the present paste composition.

The lithium-containing component, such as $Li_2CO_3$, may have an average particle size that is in the range of about 10 nanometers to about 10 microns, or in the range of about 40 nanometers to about 5 microns, or in the range of about 60 nanometers to about 3 microns, or in the range of about 0.1 to about 1.7 microns, or in the range of about 0.3 to about 1.3 microns, or that is less than 0.1 μm. In one embodiment, $Li_2CO_3$ is present in the range of 0.1 to 5% by weight based on the solids of the paste composition. In still a further embodiment, $Li_2CO_3$ is present in the range of 0.1 to 3% by weight.

While the present invention is not limited by any particular theory of operation, it is believed that, upon firing, the discrete lithium component acts in concert with the glass material in the present paste composition to promote etching and rapid digestion of the insulating layer conventionally used on the front side of a photovoltaic cell. The efficient etching in turn permits the formation of a low-resistance, front-side electrical contact between the conductive metal(s) of the composition and the underlying substrate. Ideally, the firing process results in a substantially complete removal of the insulating layer without any further combination of the metals with the underlying Si substrate. Although Li is known as a constituent of some oxide glasses, its separate inclusion in the present paste composition in the form of one or more discrete Li compounds is believed to improve the kinetics of the etching of the insulating layer. Surprisingly, fabrication of high-efficiency photovoltaic cells is possible using the present paste composition with its Li-containing additive.

In preparing a paste composition of this invention, the inorganic components described above may be mixed with an organic medium, e.g. by mechanical mixing, to form a viscous composition referred to as a "paste", which has suitable consistency and rheology for a printing process such as screen printing. The organic medium is typically a vehicle in which the inorganic components are dispersible with a good degree of stability. In particular, the composition preferably has a stability compatible not only with the requisite manufacturing, shipping, and storage, but also with conditions encountered during deposition, e.g. by a screen-printing process. Ideally, the rheological properties of the medium are such that it lends good application properties to the composition, including stable and uniform dispersion of solids, appropriate viscosity and thixotropy for screen printing, appropriate wettability of the paste solids and the substrate on which printing will occur, a rapid drying rate after deposition, and stable firing properties.

A wide variety of inert viscous materials can be used in an organic medium in the present composition including, without limitation, an inert, non-aqueous liquid that may or may not contain thickeners, stabilizers, or surfactants. By "inert"

is meant a material that may be removed by a firing operation without leaving any substantial residue that is detrimental to final conductor line properties. The solvents most widely used to form such a paste composition are ester alcohols and terpenes such as alpha- or beta-terpineol or mixtures thereof with other solvents such as kerosene, dibutylphthalate, butyl carbitol, butyl carbitol acetate, hexylene glycol, and high-boiling alcohols and alcohol esters.

In another embodiment, the organic medium may be a solution of one or more polymers, such as ethyl cellulose, in a solvent. Other examples of suitable polymers include ethylhydroxyethyl cellulose, wood rosin, mixtures of ethyl cellulose and phenolic resins, polymethacrylates of lower alcohols, and a monobutyl ether of polyethylene glycol monoacetate. When a polymer is present in the organic medium, its content therein may be in the range of about 8 wt. % to about 11 wt. %. A composition of the present invention formed as a paste having good wetting characteristics typically contains 85 to 95 wt. % of the inorganic components and 5 to 15 wt. % of the organic medium. In one embodiment, the $Li_2CO_3$ is present in the range of 0.1 to 5% by weight based on solids. In still a further embodiment, the $Li_2CO_3$ is present in the range of 0.1 to 3%.

As a paste, the present composition can be applied on a preselected portion of the substrate in a variety of different configurations or patterns, such as bars or lines useful as an electrode. Alternatively, the preselected portion may cover substantially all of a major surface of the substrate. The electrode is formed by depositing the paste on the substrate in a preselected pattern, drying the paste (optionally by exposure to a modestly elevated temperature), and thereafter firing the deposited, dried paste. The firing process removes the organic medium, sinters the conductive metal in the composition, and establishes electrical contact between the semiconductor substrate and the fired conductive metal. The substrate may be a semiconductor such as a thin single-crystal or multi-crystalline silicon wafer having first and second major surfaces on its opposite large sides; the substrate is preferably a junction-bearing substrate. Firing may be performed in an atmosphere composed of air, nitrogen, an inert gas, or a mixed gas of oxygen and nitrogen.

The present paste composition can be deposited on the substrate by a variety of processes, such as printing. Exemplary printing processes include screen printing, plating, extrusion, inkjet, shaped, multiple, or ribbon printing. Conductors formed by printing and firing a paste such as that provided herein are often denominated as "thick-film" conductors, since they are ordinarily substantially thicker than traces formed by atomistic processes, such as those used in fabricating integrated circuits. For example, thick-film conductors may have a thickness after firing of about 1 to 100 μm. Consequently, paste compositions that in their processed form provide conductivity and are suitably used for printing processes are often called "thick-film pastes" or "conductive inks."

The present paste composition may be printed on the substrate in any useful pattern. If the substrate includes an insulating surface layer, the composition may be printed atop the layer. For example, the electrode pattern used for the front side of a photovoltaic cell commonly includes a plurality of narrow grid lines or fingers connected to one or more bus bars. In an embodiment, the width of the lines of the conductive fingers may be 20 to 200 μm, 40 to 150 μm, or 60 to 100 μm wide and 10 to 30 μm thick and the fingers may be spaced by 2 to 3 mm on center. The thickness of the lines of the conductive fingers may be 5 to 50 μm; 10 to 35 μm; or 15 to 30 μm. Since the features of the pattern are opaque, light impinging on them cannot be converted by the cell, decreasing apparent cell efficiency. However, reducing the feature size of the conductors undesirably increases their electrical resistance. The possibility of increasing a trace's cross-sectional area by increasing its thickness is limited by what can be attained in practical printing or other deposition processes. Thus, cell designers typically must size the electrode features to balance the effects of active collection area and ohmic losses. Such a pattern permits the generated current to be extracted without undue resistive loss, while minimizing the area of the front side obscured by the metallization, which reduces the amount of incoming light energy that cannot be converted to electrical energy. Ideally, the features of the electrode pattern should be well defined and have high electrical conductivity and low contact resistance with the underlying structure.

After being deposited, the paste is dried, either under ambient conditions or by exposure to a modestly elevated temperature. Thereafter, the paste is fired, with the time/temperature profile conditions for the firing typically being set so as to enable a substantially complete burnout and removal of the organic medium binder materials from the paste as it has dried on the substrate. Normally, the firing entails some combination of volatilization and/or pyrolysis to remove the organic materials. In different embodiments, the burn-out temperature may in the range between about 300° C. to about 1000° C., or about 300° C. to about 525° C., or about 300° C. to about 650° C., or about 650° C. to about 1000° C. The firing may be conducted using any suitable heat source. In an embodiment, the firing is accomplished by passing the substrate bearing the printed conductor through a belt furnace at high transport rates, for example between about 100 to about 500 centimeters per minute with resulting dwell times between about 0.05 to about 5 minutes. Multiple temperature zones may be used to control the desired thermal profile, and the number of zones may vary, for example, between 3 to 11 zones. The temperature of a burn-out operation conducted using a belt furnace is conventionally specified by the set point in the hottest zone of the furnace, but it is generally found that the actual peak temperature attained by the transiting substrate is somewhat lower.

In another aspect, the present invention relates to a process of manufacturing a device, such as an electrical, electronic, semiconductor, or photovoltaic device. An embodiment includes the steps of:

(a) providing a semiconductor substrate having a first major surface;

(b) applying on a preselected portion of the first major surface a paste composition comprising a substantially lead-free inorganic solid portion dispersed in an organic medium and wherein the inorganic solid portion comprises:
   (i) about 75% to about 99% by weight based on solids of a source of electrically conductive metal;
   (ii) about 0.1% to about 10% by weight based on solids of a substantially Pb-free glass component; and
   (iii) about 0.1% to about 5% by weight based on solids of at least one Li-containing component; and (c) thereafter firing the semiconductor substrate and paste composition, whereby, upon the firing, the organic medium is removed, and the electrically conductive metal is sintered and an electrode is formed that has electrical contact with the underlying semiconductor substrate.

After being deposited, the paste is preferably first dried, optionally by exposure to a modestly elevated temperature. The time/temperature profile conditions for the firing are typically set so as to effect substantially complete removal of the organic medium.

The semiconductor substrate used in the foregoing process may include an insulating layer on its first major surface, in which case the paste composition is applied over the insulating layer and the firing step preferably acts to remove at least a portion of the insulating layer to permit establishment of contact between the metal contained in the deposited paste composition and the underlying substrate.

Embodiments of the present method that employ a semiconductor substrate optionally include the further step of forming the insulating layer on the semiconductor substrate prior to the application of the paste composition. The insulating layer may comprise one or more components selected from aluminum oxide, titanium oxide, silicon nitride, $SiN_x$:H (silicon nitride containing hydrogen for passivation during subsequent firing processing), silicon oxide, and silicon oxide/titanium oxide, and may be in the form of a single layer or multiple layers. The insulating layer included in some implementations provides the cell with an antireflective property, which lowers the cell's surface reflectance of light incident thereon, thereby improving the cell's utilization of incident light and increasing the electrical current it can generate. The thickness of the layer is preferably chosen to maximize the antireflective property in accordance with the layer material's refractive index. In some embodiments, the deposition processing conditions are adjusted to vary the stoichiometry of the layer, thereby altering properties such as the refractive index to a desired value. For a silicon nitride film with a refractive index of about 1.9 to 2.0, a thickness of about 700 to 900 Å (70 to 90 nm) is suitable.

In an embodiment, the insulating layer may be deposited on the substrate by methods known in the microelectronics art, such as any form of chemical vapor deposition ("CVD") including plasma-enhanced CVD ("PECVD") or thermal CVD, thermal oxidation, or sputtering. In another embodiment, the substrate is coated with a liquid material that under thermal treatment decomposes or reacts with the substrate to form the insulating layer. In still another embodiment, the substrate is thermally treated in the presence of an oxygen- or nitrogen-containing atmosphere to form an insulating layer. Alternatively, no insulating layer is specifically applied to the substrate, but a naturally forming substance, such as silicon oxide on a silicon wafer, may function as an insulating film.

After being deposited, the paste is fired, optionally after first being dried by exposure to a modestly elevated temperature. The time/temperature profile conditions for the firing are typically set so as to, typically involving In various embodiments, a portion of any insulating layer present, whether specifically applied or naturally occurring, may be removed to enhance electrical contact between the paste composition and the underlying semiconductor substrate. Preferably, the glass component and lithium-containing additive act to at least partially dissolve the insulating layer to permit contact to be established.

In an embodiment, the foregoing process can be used to fabricate a photovoltaic cell. One possible sequence of steps is illustrated in FIG. 1(a) through 1(f).

FIG. 1(a) shows a p-type substrate 10, which may be single-crystal, multicrystalline, or polycrystalline silicon. Substrate 10 may be sliced, for example, from an ingot that has been formed from a pulling or casting process. Surface damage, e.g. from slicing with a wire saw, and contamination may be removed by etching away about 10 to 20 μm of the substrate surface using an aqueous alkali solution such as aqueous potassium hydroxide or aqueous sodium hydroxide, or using a mixture of hydrofluoric acid and nitric acid. In addition, a step in which the substrate is washed with a mixture of hydrochloric acid and hydrogen peroxide may be added to remove heavy metals such as iron adhering to the substrate surface. Substrate 10 may have a first major surface 12 that is textured to reduce light reflection. Texturing may be produced by etching a major surface with an aqueous alkali solution such as aqueous potassium hydroxide or aqueous sodium hydroxide.

Figure 1B:
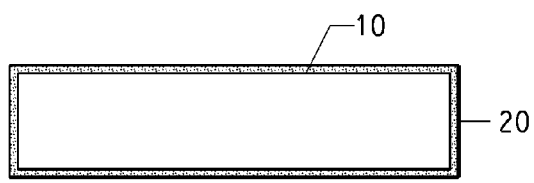

In FIG. 1(b), an n-type diffusion layer 20 is formed to create a p-n junction with p-type material below. The n-type diffusion layer 20 can be formed by any suitable doping process, such as thermal diffusion of phosphorus (P) provided from phosphorus oxychloride ($POCl_3$). In the absence of any particular modifications, the n-type diffusion layer 20 is formed over the entire surface of the silicon p-type substrate. The depth of the diffusion layer can be varied by controlling the diffusion temperature and time, and is generally formed in a thickness range of about 0.3 to 0.5 microns. The n-type diffusion layer may have a sheet resistivity from several tens of ohms per square up to about 120 ohms per square or more.

Figure 1C:

After protecting one surface of the n-type diffusion layer 20 with a resist or the like, the n-type diffusion layer 20 is removed from most surfaces by etching so that it remains only on the first major surface 12 of substrate 10, as shown in FIG. 1(c). The resist is then removed using an organic solvent or the like.

Figure 1D:
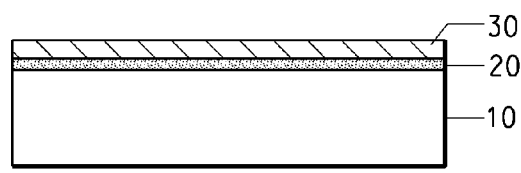

Next, as shown in FIG. 1(d), an insulating layer 30, which also functions as an antireflective coating, is formed on the n-type diffusion layer 20. The insulating layer is commonly silicon nitride, but can also be a film of another material, such as $SiN_x$:H (i.e., the insulating film comprises hydrogen for passivation during subsequent processing), titanium oxide, silicon oxide, mixed silicon oxide/titanium oxide, or aluminum oxide. The insulating layer can be in the form of a single layer or multiple layers.

Figure 1E:
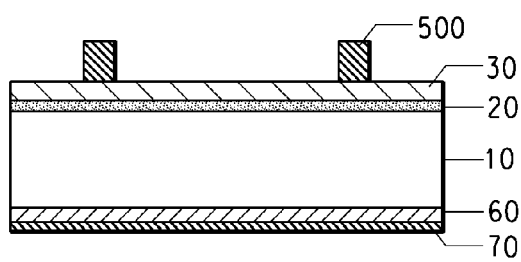

Next, electrodes are formed on both major surfaces 12, 14 of the substrate. As shown in FIG. 1(e), a paste composition 500 of this invention is screen-printed on the insulating layer 30 of the first major surface 12 and then dried. For a photovoltaic cell, paste composition 500 is typically applied in a predetermined pattern of conductive lines extending from one or more bus bars that occupy a predetermined portion of the surface. In addition, aluminum paste 60 and back-side silver paste 70 are screen-printed onto the back side (the second major surface 14 of the substrate) and successively dried. The screen-printing operations may be carried out in any order. For the sake of production efficiency, all these pastes are typically processed by co-firing them at a temperature in the range of about 700° C. to about 975° C. for a period of from several seconds to several tens of minutes in air or an oxygen-containing atmosphere. An infrared-heated belt furnace is conveniently used for high throughput.

Figure 1F:
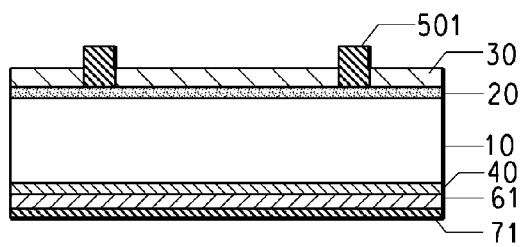

As shown in FIG. 1(f), the firing causes the depicted paste composition 500 on the front side to sinter and penetrate through the insulating layer 30, thereby achieving electrical contact with the n-type diffusion layer 20, a condition known as "fire through." This fired-through state, i.e., the extent to which the paste reacts with, and passes through, the insulating layer 30, depends on the quality and thickness of the insulating layer 30, the composition of the paste, and on the firing conditions. Firing thus converts paste 500 into electrode 501, as shown in FIG. 1(f).

The firing further causes aluminum to diffuse from the back-side aluminum paste into the silicon substrate, thereby forming a p+ layer 40, containing a high concentration of aluminum dopant. This layer is generally called the back surface field (BSF) layer, and helps to improve the energy conversion efficiency of the solar cell. Firing converts the dried aluminum paste 60 to an aluminum back electrode 61.

The back-side silver paste 70 is fired at the same time, becoming a silver or silver/aluminum back electrode 71. During firing, the boundary between the back-side aluminum and the back-side silver assumes the state of an alloy, thereby achieving electrical connection. Most areas of the back electrode are occupied by the aluminum electrode, owing in part to the need to form a p+ layer 40. Since there is no need for incoming light to penetrate the back side, substantially the entire surface may be covered. At the same time, because soldering to an aluminum electrode is unfeasible, a silver or silver/aluminum back electrode is formed on limited areas of the back side as an electrode to permit soldered attachment of interconnecting copper ribbon or the like.

The glass material in the paste composition is preferably selected for its capability to rapidly digest the insulating layer. For example, the paste composition could contain first and second glass components. The second glass component can in such case be designed to slowly blend with the first glass component while retarding the chemical activity. A stopping condition may result, such that the insulating layer is at least partially removed but without attacking the underlying emitter diffused region, which potentially would shunt the device, were the corrosive action the paste composition is preferably selected for its capability to rapidly digest the insulating layer. For example, the paste composition could contain first and second glass components. The second glass component can in such case be designed to slowly blend with the first glass component while retarding the chemical activity. A stopping condition may result, such that the insulating layer is at least partially removed but without attacking the underlying emitter diffused region, which potentially would shunt the device, were the corrosive action to proceed unchecked. Such a glass component may be characterized as having a sufficiently high viscosity to provide a stable manufacturing window to remove insulating layers without damage to the diffused p-n junction region of the semiconductor substrate. Ideally, the firing process results in a substantially complete removal of the insulating layer without further combination with the underlying Si substrate.

While the present invention is not limited by any particular theory of operation, it is believed that, upon firing, the presence of the lithium component in the present paste composition promotes etching of the insulating layer, which in turn permits the formation of a low-resistance, front-side electrical contact between the metal(s) of the composition and the underlying substrate.

The nature of the fired-through state, i.e., the extent to which the present paste composition formed as electrode 500 melts and passes through the insulating layer to form electrical contact with the substrate after firing, depends on the quality and thickness of the insulating layer, the composition of the layer and the electrode paste, and the firing conditions. A high-quality fired-through state is believed to be an important factor in obtaining high conversion efficiency in a photovoltaic cell.

It will be understood that the present paste composition and process may also be used to form electrodes, including a front-side electrode, of a photovoltaic cell in which the p- and n-type layers are reversed from the construction shown in FIG. 1, so that the substrate is n-type and a p-type material is formed on the front side.

In yet another embodiment, this invention provides a semiconductor device that comprises a semiconductor substrate having a first major surface; an insulating layer optionally present on the first major surface of the substrate; and, disposed on the first major surface, a conductive electrode pattern having a preselected configuration and formed by firing a paste composition as described above.

A semiconductor device fabricated as described above may be incorporated into a photovoltaic cell. In another embodiment, this invention thus provides a photovoltaic cell array that includes a plurality of the semiconductor devices as described, and made as described, herein.

In an embodiment, the processing of photovoltaic device cells utilizes nitrogen, forming gas, or other inert gas firing of the prepared cells.

In an embodiment, the structure may not include an insulating film that has been applied, but instead may contain a naturally forming substance, such as silicon oxide, which may function as an insulating film.

In an aspect of this embodiment, the glass frits or fluxes are lead-free.

An embodiment of the invention relates to semiconductor device formed by a process described herein. An embodiment of the invention relates to a solar cell including an electrode, which includes a metal powder and one or more glass frits or fluxes, wherein the glass frits or fluxes are lead-free.

EXAMPLES

The operation and effects of certain embodiments of the present invention may be more fully appreciated from a series of examples described below. The embodiments on which these examples are based are representative only, and the selection of those embodiments to illustrate aspects of the invention does not indicate that materials, components, reactants, conditions, techniques and/or configurations not described in the examples are not suitable for use herein, or that subject matter not described in the examples is excluded from the scope of the appended claims and equivalents thereof. The significance of the examples is better understood by comparing the results obtained therefrom with the results obtained from certain trial runs that are designed to serve as controlled experiments and provide a basis for such comparison since they do not contain a lithium component in the conductive paste.

Paste Preparation

With the exception of the metal component, all inorganic ingredients used in the following examples (i.e., glass component and lithium-containing additive component) were ball milled in separate steps in a polyethylene container with zirconia balls and an appropriate solvent until the median particle size ($D_{50}$) was in the range of 0.5-0.7 µm. The glass components were lead-free glass frits as described below. Lithium oxide was supplied by Alfa Aesar (#41832, 99.5%); lithium carbonate was supplied by Sigma-Aldrich (#431559, 99.99%); and lithium fluoride was supplied by Sigma-Aldrich (#203645, 99.98%).

All the organic ingredients, including solvents, vehicles, surfactants, binders, and viscosity modifiers were put into a Thinky (Thinky USA, Inc, Laguna Hills, Calif.) mixing jar and Thinky mixed at 2000 RPM for 2 to 4 minutes until well blended. All inorganic ingredients were then put into a glass jar and tumble-mixed for 15 minutes. One third of inorganic ingredients were then added to the Thinky jar containing the organic ingredients and Thinky-mixed for 1 minute at 2000 RPM. This was repeated until all inorganics were added and mixed. The paste was cooled and the viscosity was adjusted to between 200 and 500 Pa-s by adding solvent and Thinky mixing for 1 minute at 2000 RPM. This step was repeated until the correct viscosity was achieved. The paste was then roll milled at a 1 mil gap for 3 passes at zero pressure and 3 passes at 75 PSI using a three-roll mill (Charles Ross & Son Co., Hauppauge, N.Y.).

The degree of dispersion was measured by the fineness of grind (FOG), using test equipment in accordance with ASTM Standard Test Method D 1210-05, which is promulgated by ASTM International, West Conshohocken, Pa., and is incorporated herein by reference. In an embodiment, the largest particles detected in the present paste composition using the FOG test may be approximately 20 μm in size, and the median particle size may be about 10 μm.

After a 24 hour holding period, to ensure the paste composition had rheological characteristics suitable for screen printing, its viscosity was measured and adjusted, if necessary, to between 200 and 320 Pa-s with the addition of solvent and Thinky mixing. Viscosity was determined using a Brookfield viscometer (Brookfield Inc., Middleboro, Mass.) with a #14 spindle and a #6 cup. Viscosity values were taken after 3 minutes at 10 RPM.

Photovoltaic Cell Fabrication

The performance of conductive pastes of the invention and comparative examples was evaluated using photovoltaic cells constructed using 160 micron thick Q.Cell (Q-Cells SE, OT Thalheim, Germany) multicrystalline silicon wafers with a 65 ohm/sq phosphorus-doped emitter layer prepared by a $POCl_3$ diffusion process. As supplied, the wafers had a textured surface formed by an acid-etching treatment. A 70-nm thick $SiN_x$ antireflective coating had been applied to the front-side major surface using a PECVD process. For convenience, the fabrication and electrical testing were carried out using "cut down" test wafers, i.e. 28 mm×28 mm wafers diced from 156 mm×156 mm starting wafers using a diamond wafering saw. The test wafers were screen printed using an AMI-Presco (AMI, North Branch, N.J.) MSP-485 screen printer, first to form a full ground plane back-side conductor using a conventional Al-containing paste (DuPont PV381), and thereafter to form a bus bar and eleven conductor lines at a 0.254 cm pitch on the front surface using the various exemplary pastes herein.

The cells were dried at 150° C. for 20 minutes after printing the back sides and again after printing the front sides. The dried, printed cells were fired in a BTU International rapid thermal processing, multi-zone belt furnace. The firing temperatures set forth in the Examples below were the furnace set-point temperatures in the hottest furnace zone. The furnace set-point temperature was found to be approximately 125° C. greater than the peak wafer temperature actually attained by the cell during its passage through the furnace. After firing, the conductor lines had a median line width of 120 μm and a mean line height of 15 μm. The median line resistivity was 3.0 μΩ-cm. Performance of "cut-down" cells, such as the present 28×28 mm cells, is known to be impacted by edge effects, which reduce the overall solar cell fill factor (FF) by approximately 5% from what would have been obtained with full-size wafers.

Photovoltaic Cell Electrical Measurements

Photovoltaic cell performance was measured using a ST-1000, Telecom STV Co. IV tester at 25° C.±1.0° C. The Xe arc lamp in the IV tester simulated the sunlight and irradiated the front surface of the cell with a known intensity. The tester used a four-contact method to measure current (I) and voltage (V) at approximately 400 load resistance settings to determine the cell's I-V curve. Photovoltaic cell efficiency (Eff), fill factor (FF), and series resistance ($R_s$) were calculated from the I-V curve. High values of Eff and FF and a low value of $R_s$ are desired for a photovoltaic cell. $R_s$ is known to be especially affected by contact resistance ($\rho_c$) and conductor line resistance. Since conductor line resistances were nominally equivalent for the various samples (3.0 μΩ-cm), the differences in Rs were primarily due to $\rho_c$. Ideality factor was determined using the Suns-VOC technique. Ideality factor data are preferably obtained at 0.1 sun irradiance, which is believed to provide a more sensitive indication of diode quality and a more effective measure of p-n junction damage than comparable data taken at a 1.0 sun irradiance level. A low ideality factor is desirable.

Efficiency, fill factor, series resistance, and ideality factor values were obtained for photovoltaic cells having front-side electrodes provided from paste compositions having Li-containing additives. Corresponding data were also obtained for cells having front-side electrodes made with paste not having Li-containing additives. For each condition shown, multiple cells were fabricated and tested. The performance values listed at each condition represent the median of the data measured for these cells.

Comparative Example A

A paste sample was formulated with a composition in which the glass frit was loaded to 7 wt. % of the inorganics and had the following nominal composition, as stated in weight percentage based on the total glass frit composition given in Table A:

TABLE A

| $SiO_2$ | $Al_2O_3$ | $Bi_2O_3$ | $BiF_3$ | $ZrO_2$ | ZnO | $P_2O_5$ |
|---|---|---|---|---|---|---|
| 11.98 | 2.75 | 42.25 | 17.67 | 1.54 | 20.28 | 3.54 |

The silver concentration was adjusted to provide an inorganic solids level of 88% in the paste.

The organic medium used had the nominal composition listed in Table I below, the weight percentages based on the total organics present.

TABLE I

| Organic components of the paste composition | |
|---|---|
| Component | Wt. % |
| 2,2,4-trimethyl-1,3-pentanediol monoisobutyrate | 46.42 |
| Ethyl Cellulose (50-52% ethoxyl) | 1.17 |
| Ethyl Cellulose (48-50% ethoxyl) | 0.33 |
| N-tallow-1,3-diaminopropane dioleate | 8.33 |
| Hydrogenated castor oil | 4.17 |
| Pentaerythritol tetraester of perhydroabietic acid | 10.42 |
| Dimethyl adipate | 26.25 |
| Dimethyl glutarate | 2.92 |

A total of 25 samples were screen printed using this paste. Five of these samples were fired at each of the following peak temperatures: 870, 890, 910, 930 and 950° C. Optimal performance was seen in the samples fired at a peak firing temperature of 890° C., which had a mean efficiency of 13.78%.

Example 1

The experiment described in Comparative Example A was repeated with the same organic medium, but with the inclusion of a $Li_2CO_3$ additive at a level of 0.6 wt. %, based on the total paste composition. The silver concentration was adjusted to maintain an inorganic solids level of 88%. Optimal performance was again seen at a peak firing temperature of 890° C., but the mean efficiency of the five samples increased to 14.37%, a clear improvement of over 0.5% efficiency relative to the properties of the Comparative Example A cells.

Comparative Example B

The experiment described in Comparative Example A was repeated with the same organic medium, but with the frit level reduced to 4% and with no Li-component addition. The silver concentration was adjusted to maintain the inorganic solids level at 88%. Optimal performance was seen at a peak firing temperature of 950° C., which yielded a mean efficiency of 12.76% for the five samples.

Examples 2 and 3

The experiment described in Comparative Example B was repeated with the same organic medium and frit at 1% and 6%, but with $Li_2CO_3$ addition at 0.2 wt. %. In both cases, the silver concentration was adjusted to keep the inorganic solids level at 88%. With 1% frit, the optimal performance was at a peak firing temperature of 950° C. and the mean efficiency of the five samples was 13.8%, a clear improvement of over 1% efficiency relative to the Comparative Example B. With 6% frit, the optimal performance was at a peak firing temperature of 910° C. and the mean efficiency of the five samples was 14.3%, a clear improvement of over 1.5% efficiency relative to the Comparative Example B.

Example 4

A statistically-designed experiment utilizing 12 different compositions was carried out to determine the optimal content of frit and Li-containing additive. The compositions employed the same frit used in Comparative Example A at levels varying from 1 to 9% and with $Li_2CO_3$ addition at levels varying from 0 to 1.6%. In each composition, the silver concentration was adjusted to keep the inorganic solids level at 88%. Statistical analysis of the results using Minitab 15 (Minitab Inc., State College, Pa.) predicted an optimal efficiency at 0.6% $Li_2CO_3$ and about 8% frit.

Comparative Example C

A paste sample was formulated with the same organic medium and silver used in Comparative Example A. The glass frit was loaded to 2% of the overall paste composition and had the following nominal composition given in Table B:

TABLE B

| $SiO_2$ | $Al_2O_3$ | $B_2O_3$ | $Bi_2O_3$ | $TiO_2$ | $ZrO_2$ | $Na_2O$ | $Li_2O$ |
|---|---|---|---|---|---|---|---|
| 21.92 | 0.28 | 3.84 | 64 | 2.01 | 4.81 | 1.64 | 1.5 |

The silver concentration was adjusted to keep the inorganic solids level at 88%. The samples were screen printed and fired at peak temperatures of 840, 865, 890, 915 and 940° C. Optimal performance was at a peak firing temperature of 940° C. and the mean efficiency of the samples was 1.09%, which is too low for a photovoltaic cell to be commercially desirable.

Examples 5 and 6

The experiment described in Comparative Example C was repeated, but with a frit loading of 2 wt. % and with inclusion of $Li_2CO_3$ at levels of 0.4 and 1.2 wt. %. Again, the silver concentration was adjusted to keep the inorganic solids level at 88%. Optimal performance for the 0.4% sample was at a peak firing temperature of 890° C. and the median efficiency of the five samples was 14.15%, a large improvement of over the Comparative Example C and also an improvement over Example A. Optimal performance for the 1.2% sample was at a peak firing temperature of 850° C. and the median efficiency of the five samples was 10.81%. This value is substantially higher than obtained for Comparative Example C. It is thus regarded that the there will be an optimal concentration of $Li_2CO_3$ for any given frit composition, but the addition of discrete $Li_2CO_3$ to the present paste composition still permits the construction of photovoltaic cells having properties that are superior to those constructed with alternative paste compositions that lack $Li_2CO_3$ or other discrete Li-containing additives used herein.

Examples 7-10

Paste samples were formulated with the same organic medium and silver used in Comparative Example A. The glass frit was loaded to 2% of the overall paste composition and had the following nominal composition given in Table C:

TABLE C

| $SiO_2$ | $Al_2O_3$ | $ZrO_2$ | $B_2O_3$ | $Na_2O$ | $Li_2O$ | $Bi_2O_3$ |
|---|---|---|---|---|---|---|
| 1.86 | 0.34 | 0.27 | 12.95 | 0.41 | 1.59 | 82.57 |

Paste composition samples were prepared with discrete $Li_2CO_3$ additives as shown in Table II below. The silver concentration was adjusted to keep the inorganic solids level at 88%. The samples were screen printed onto Si wafers and fired at peak temperatures of 860, 875, 890, and 905° C. Electrical properties of the resulting PV cells were tested as described above. Data for the cells at the optimal firing temperature is set forth in Table II.

TABLE II

Processing Conditions and Properties of Photovoltaic Cells

| Ex. No. | Wt % Additive | Pk. Temp. (° C.) | Fill Factor (%) | Efficiency (%) | Series Resistance (Ω) | Ideality Factor |
|---|---|---|---|---|---|---|
| 7 | 0.27 | 860 | 68.7 | 12.57 | 0.235 | 3.7 |
| 8 | 0.41 | 875 | 70.3 | 13.0 | 0.237 | 3.1 |
| 9 | 0.82 | 890 | 67.7 | 12.1 | 0.239 | 3.7 |
| 10 | 1.76 | 905 | 64.2 | 11.75 | 0.268 | 3.9 |

The efficiency values of the photovoltaic cells shown in Table II compare favorably with values exhibited in Comparative Examples A, B, and C. The other characteristics shown in Table II also indicate cells that are well suited for their intended use.

What is claimed is:

1. A paste composition comprising an inorganic solid portion comprising:
   (a) about 75% to about 99% by weight based on solids of a source of electrically conductive metal;
   (b) about 0.1% to about 10% by weight based on solids of a substantially lead-free glass component comprising:
       1-25 wt. % of $SiO_2$;
       0.1-3 wt. % of $Al_2O_3$;

50-85 wt. % of at least one of bismuth oxide and bismuth fluoride, the amount of bismuth oxide being at least 10 wt. % and the amount of bismuth fluoride being at most 50 wt. %; and at least 1 wt. % of at least one of $TiO_2$, $ZrO_2$, $Li_2O$, ZnO, $P_2O_5$, LiF, NaF, KF, $K_2O$, $V_2O_5$, $GeO_2$, $TeO_2$, $CeO_2$, $Gd_2O_3$, or a mixture thereof;

wherein the weight percentages are based on the total glass component; and (c) about 0.1 to about 5% by weight based on solids of a discrete lithium-containing additive;

wherein the inorganic solid portion is dispersed in an organic medium and the paste composition is substantially Pb-free.

2. The paste composition of claim 1, wherein the lithium-containing additive is at least one of lithium oxide, lithium hydroxide, a lithium salt of an inorganic or organic acid, or a mixture thereof.

3. The paste composition of claim 2, wherein the lithium-containing additive is LiF.

4. The paste composition of claim 2, wherein the lithium-containing additive is $Li_2CO_3$.

5. The paste composition of claim 1, wherein the substantially lead-free glass component comprises 8-25 wt. %, based on the total glass component.

6. The paste composition of claim 1, wherein the electrically conductive metal is at least one of gold, silver, copper, nickel, palladium, or an alloy or a mixture thereof.

7. The paste composition of claim 6, wherein the electrically conductive metal is silver.

8. The paste composition of claim 1, wherein the source of electrically conductive metal is finely divided silver particles.

9. An article comprising: (a) a semiconductor substrate having a first major surface; and (b) a deposit of the substantially lead-free paste composition of claim 1 on a preselected portion of the first major surface of the semiconductor substrate.

10. The article of claim 9, wherein an insulating layer is present on the first major surface of the semiconductor substrate and the paste composition is deposited on the insulating layer.

11. The article of claim 10, wherein the paste composition has been fired to remove the organic medium and form an electrode that has electrical contact with the semiconductor substrate.

12. The article of claim 10, wherein the semiconductor substrate is a silicon wafer.

13. A process comprising: (a) providing a semiconductor substrate having a first major surface; (b) applying the substantially Pb-free paste composition of claim 1 onto a preselected portion of the first major surface, and (c) firing the substrate and the paste composition, whereby the organic medium of the paste composition is removed and an electrode is formed having electrical contact with the semiconductor substrate.

14. The process of claim 13, wherein an insulating layer is disposed on the first major surface and the paste composition is applied over the insulating layer.

15. The process of claim 14, wherein the insulating layer comprises at least one of aluminum oxide, titanium oxide, silicon nitride, $SiN_x$:H, silicon oxide, and silicon oxide/titanium oxide.

16. The process of claim 14, wherein the insulating layer is a naturally occurring layer.

17. The process of claim 13, wherein the paste composition is applied onto the first major surface in a preselected pattern.

18. The process of claim 13, wherein the firing is carried out in air or an oxygen-containing atmosphere.

19. The process of claim 13, wherein the electrically conductive metal is finely divided silver present in an amount ranging from about 75% to 99% by weight based on the inorganic solids.

* * * * *